(12) United States Patent
Radosavljevic et al.

(10) Patent No.: US 11,715,791 B2
(45) Date of Patent: Aug. 1, 2023

(54) GROUP III-NITRIDE DEVICES ON SOI SUBSTRATES HAVING A COMPLIANT LAYER

(71) Applicant: Intel Corporation, Santa Clara, CA (US)

(72) Inventors: Marko Radosavljevic, Portland, OR (US); Han Wui Then, Portland, OR (US); Sansaptak Dasgupta, Hillsboro, OR (US); Kevin Lin, Beaverton, OR (US); Paul Fischer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 252 days.

(21) Appl. No.: 16/643,930

(22) PCT Filed: Sep. 28, 2017

(86) PCT No.: PCT/US2017/054083
§ 371 (c)(1),
(2) Date: Mar. 3, 2020

(87) PCT Pub. No.: WO2019/066866
PCT Pub. Date: Apr. 4, 2019

(65) Prior Publication Data
US 2020/0411678 A1     Dec. 31, 2020

(51) Int. Cl.
*H01L 29/778*     (2006.01)
*H01L 27/12*     (2006.01)
(Continued)

(52) U.S. Cl.
CPC ...... *H01L 29/7786* (2013.01); *H01L 27/1203* (2013.01); *H01L 29/2003* (2013.01); *H01L 29/66462* (2013.01); *H01L 29/7787* (2013.01)

(58) Field of Classification Search
CPC .................. H01L 29/7787; H01L 29/7786
See application file for complete search history.

(56) References Cited

U.S. PATENT DOCUMENTS

| 8,487,316 | B2 | 7/2013 | Cheng et al. |
| 8,604,486 | B2 * | 12/2013 | He ............... H01L 29/1066 |
| | | | 438/496 |

(Continued)

FOREIGN PATENT DOCUMENTS

| JP | 2011101007 | 5/2011 |
| WO | 2015088674 | 6/2015 |
| WO | 2017039587 | 3/2017 |

OTHER PUBLICATIONS

Li, X. "200V Enhancement-Mode p-GaN HEMTs Fabricated on 200 nm GaN-on-SOI With Trench Isolation for Monolithic Integration" IEEE Elec. Dev. Lett. vol. 38, No. 7, Jul. 2017 pp. 918-921 (Year: 2017).*

(Continued)

*Primary Examiner* — Grant S Withers
(74) *Attorney, Agent, or Firm* — Essential Patents Group, LLP

(57) ABSTRACT

A semiconductor-on-insulator (SOI) substrate with a compliant substrate layer advantageous for seeding an epitaxial III-N semiconductor stack upon which III-N devices (e.g., III-N HFETs) may be formed. The compliant layer may be (111) silicon, for example. The SOI substrate may further include another layer that may have one or more of lower electrical resistivity, greater thickness, or a different crystal orientation relative to the compliant substrate layer. A SOI substrate may include a (100) silicon layer advantageous for integrating Group IV devices (e.g., Si FETs), for example. To reduce parasitic coupling between an HFET and a substrate layer of relatively low electrical resistivity, one or more layers of the substrate may be removed within a region (Continued)

below the HFETs. Once removed, the resulting void may be backfilled with another material, or the void may be sealed, for example during back-end-of-line processing.

14 Claims, 6 Drawing Sheets

(51) Int. Cl.
*H01L 29/20* (2006.01)
*H01L 29/66* (2006.01)

(56) References Cited

U.S. PATENT DOCUMENTS

| | | | |
|---|---|---|---|
| 2004/0130002 A1* | 7/2004 | Weeks | H01L 29/0657 |
| | | | 257/E29.022 |
| 2008/0070355 A1 | 3/2008 | Lochtefeld et al. | |
| 2012/0305992 A1 | 12/2012 | Marino et al. | |
| 2014/0197462 A1* | 7/2014 | Briere | H01L 29/7786 |
| | | | 257/194 |
| 2014/0231870 A1 | 8/2014 | Hoke | |
| 2014/0264431 A1* | 9/2014 | Lal | H01L 29/4175 |
| | | | 257/195 |
| 2014/0361371 A1 | 12/2014 | Comeau et al. | |
| 2015/0318283 A1 | 11/2015 | Bayram et al. | |
| 2015/0348825 A1 | 12/2015 | Hebert | |
| 2016/0336437 A1* | 11/2016 | Kajitani | H01L 29/7784 |
| 2017/0005111 A1 | 1/2017 | Verma et al. | |

OTHER PUBLICATIONS

International Search Report and Written Opinion from PCT/US2017/054083 dated Jun. 28, 2018, 13 pgs.
International Preliminary Report on Patentability from PCT/US2017/054083 dated Apr. 9, 2020, 10 pgs.

* cited by examiner

US 11,715,791 B2

GROUP III-NITRIDE DEVICES ON SOI SUBSTRATES HAVING A COMPLIANT LAYER

CLAIM OF PRIORITY

This Application is a National Stage Entry of, and claims priority to, PCT Application No. PCT/US2017/054083, filed on Sep. 28, 2017 and titled "GROUP III-NITRIDE DEVICES ON SOI SUBSTRATES HAVING A COMPLIANT LAYER", which is incorporated by reference in its entirety for all purposes.

Demand for integrated circuits (ICs) in portable electronic applications has motivated greater levels of semiconductor device integration. Many advanced semiconductor devices in development leverage non-silicon semiconductor materials, a subset of which have wurtzite crystallinity. Exemplary wurtzite materials include the Group III-Nitride ("III-N" or IUPAC "13-N") materials. The III-N material system shows particular promise for high voltage and high frequency applications like power management ICs (PMICs) and radio frequency (RF) power amplifiers (PAs) found in RFICs. III-N heterostructure field effect transistors (HFETs), such as high electron mobility transistors (HEMTs) and metal oxide semiconductor (MOS) HEMTs, employ a semiconductor heterostructure with one or more heterojunction. One heterojunction is often at an interface of a GaN semiconductor crystal and another III-N semiconductor alloy, such as AlGaN or AlInN. III-N HFET devices benefit from a relatively wide bandgap (~3.4 eV), enabling higher breakdown voltages than Si-based MOSFETs, as well as high carrier mobility. The III-N material system is also useful for photonics (e.g., LEDs) and piezoelectric sensors, one or more of which may be useful to integrate with Si-based FETs into an electronic device platform.

Forming devices utilizing the wurtzite material system on large format silicon substrates is a challenge due to a large lattice mismatch (e.g., ~41% between GaN and Si) and a large thermal expansion coefficient mismatch (e.g., ~116% between Si and GaN). However, from a commercial standpoint, it is advantageous to integrate III-N transistors into the silicon fabrication infrastructure to take advantage of the economies of scale brought by 300 mm/450 mm wafer processing as well as achieve the higher device performance possible with monolithic system-on-chip (SOC) architectures.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in simplified "ideal" forms and geometries for clarity of discussion, but it is nevertheless to be understood that practical implementations may only approximate the illustrations. For example, smooth surfaces and square intersections may be drawn in disregard of finite roughness, corner-rounding, sloping sidewalls, and imperfect angular intersections characteristic of structures formed by nanofabrication techniques. Further, where considered appropriate, reference labels have been repeated among the figures to indicate corresponding or analogous elements. In the figures.

DETAILED DESCRIPTION

Figure 1:
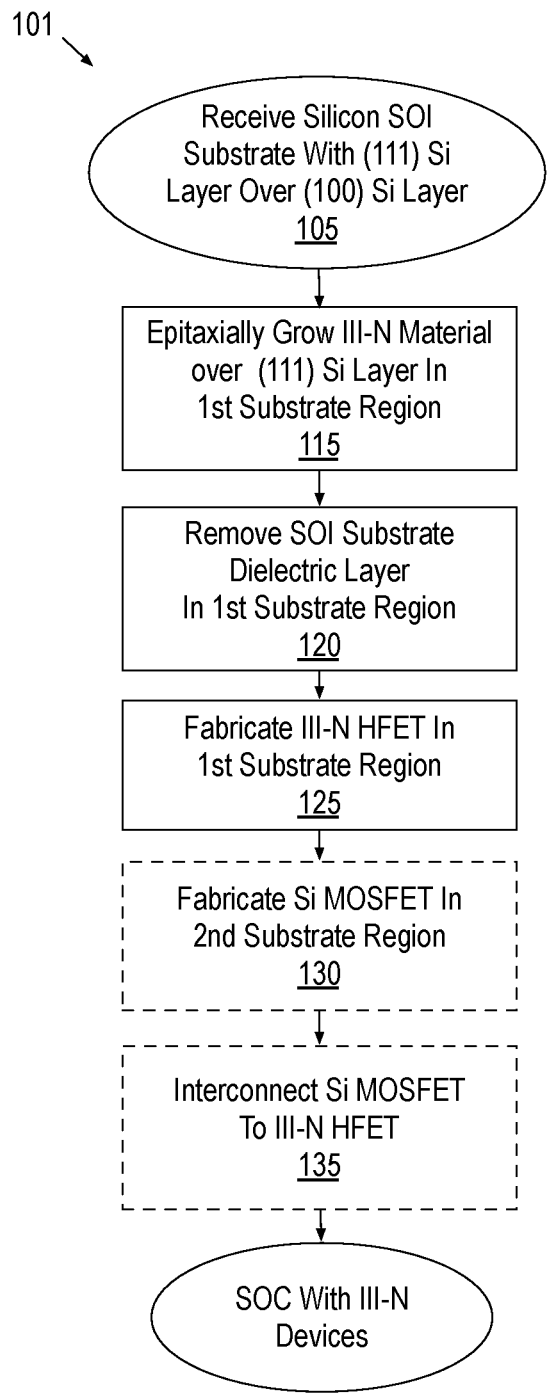
FIG. 1 is a flow diagram illustrating methods of integrating III-N HFET circuitry and Si-based FET circuitry, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "above," "under," "below," "between," and "on" as used herein refer to a relative position of one component or material with respect to other components or materials where such physical relationships are noteworthy. For example in the context of materials, one material over or under another may be directly in contact or may have one or more intervening materials. One material "over" a second material has a footprint that overlaps at least a portion of the second material's footprint. One material "above" a second material is higher within a stack of materials, but footprints of the materials need not overlap. Moreover, one material between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are IC structures incorporating semiconductor-on-insulator (SOI) substrates that have a compliant substrate layer advantageous for seeding epitaxial III-N materials. III-N devices (e.g., III-N HFETs) may then be formed from these III-N materials. The SOI substrate may further include another layer that may have one or more of higher electrical conductivity, greater thickness, or a different crystal orientation relative to the compliant substrate layer. A SOI substrate may include a (100) silicon layer advantageous for integrating Group IV devices (e.g., Si FETs), for example. To reduce parasitic coupling between an HFET and a substrate layer of relatively high electrical conductivity, one or more layers of the substrate may be removed or recess etched within a region below the HFETs. Any resulting void may be backfilled with another material, or the void may be sealed, for example during back-end-of-line processing.

In accordance with some embodiments, an SOI substrate layer employed as an epitaxial platform includes a (111) silicon layer, which has lattice parameters that are advantageous for seeding an epitaxial III-N material. In some further embodiments, the (111) silicon substrate layer may be sufficiently thin to strain during an epitaxial growth of the III-N material, thereby improving crystal quality of the III-N material. In some further embodiments, the (111) silicon substrate layer may have high electrical resistivity, for example to reduce parasitic losses between the SOI substrate layer and a III-N device. Under the (111) silicon layer, the SOI substrate may further include a substrate layer of higher conductivity, which may for example, mitigate fabrication issues associated with highly resistive substrates. In some embodiments, an SOI substrate includes a (100) silicon layer, which is advantageous for forming Group IV devices (e.g., Si FETs). To reduce parasitic coupling between the HFETs and a more conductive layer the SOI substrate, one or more layers of the SOI substrate may be removed within a region below the HFETs. For example, one or more of the substrate insulator layer, the (111) silicon layer, and/or a portion of the (100) silicon layer may be removed before or after fabricating the HFET. Once removed, the resulting void may be backfilled with another material, or the void may be sealed, for example during back-end-of-line processing.

FIG. 1 is a flow diagram illustrating a method of fabricating III-N HFET circuitry, in accordance with some embodiments. Although described in the context of advantageous HFET embodiments, it will be appreciated that similar integration may be performed for other III-N based transistor architectures (e.g., any HEMT architecture), as well as other III-N based devices, such as, but not limited to, (light emitting) diodes. Also, although methods 100 illustrate how HFET circuitry may be integrated with CMOS circuitry, it is noted that the techniques particular to HFET circuitry may be readily practiced without the added complexity of CMOS integration. As such, operations particular to CMOS integration are optional and denoted as such in FIG. 1 by dashed line.

Methods 101 begin with receiving a SOI substrate at operation 105. The SOI substrate includes at least two crystalline Group IV material layers. As described further below, these two layers have at least one of: different thicknesses, different electrical conductivities, and different crystal orientations. In some exemplary embodiments, a top substrate layer is very thin to increase the mechanical compliance of this layer. An underlying substrate layer may have a much greater thickness, for example as mechanical support in the SOI substrate. In some exemplary embodiments, a top substrate layer has low electrical conductivity (i.e., high electrical resistivity) to reduce parasitic coupling between the top substrate layer and a III-N device operable at high frequencies. An underlying substrate layer may have greater electrical conductivity, for example to mitigate fabrication issues associated with highly resistive substrates, and/or as needed for silicon-based complementary MOS (CMOS) circuitry. In some exemplary embodiments, a top substrate layer has a crystal orientation advantageous for seeding an epitaxial growth of a crystalline III-N semiconductor stack suitable for device fabrication. An underlying substrate layer may have a crystal orientation advantageous for fabricating metal-oxide-semiconductor field effect transistors (MOSFETs), and more particularly silicon-based CMOS circuitry.

Figure 2:
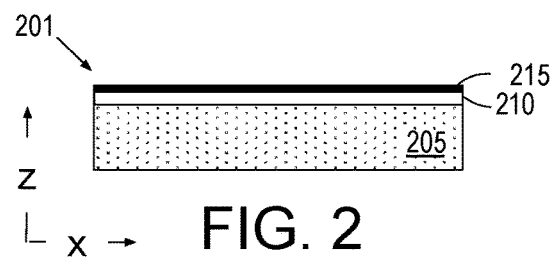
FIG. 2 is a cross-sectional view illustrating a semiconductor-on-insulator (SOI) substrate suitable for integration of III-N HFET circuitry and Si-based FET circuitry, in accordance with some embodiments of the methods illustrated in FIG. 1.
Figure 3A:
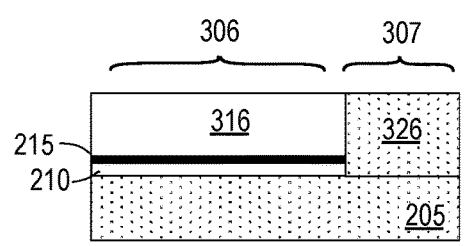
FIGS. 3A and 4A are cross-sectional views illustrating a definition of first and second regions of a substrate, formed in accordance with some embodiments of the methods illustrated in FIG. 1.

FIG. 2 is a cross-sectional view illustrating a semiconductor-on-insulator (SOI) substrate 201 suitable for integration of III-N HFET circuitry and Si-based FET circuitry, in accordance with some embodiments of methods 101. SOI substrate 201 includes a first (top) substrate layer 215. In some embodiments, substrate layer 215 has (111) crystal orientation. A top surface of the layer may therefore be a (111) crystal plane. A (111) surface of a group IV material (e.g., Silicon or SiGe) having cubic crystallinity offers a larger lattice spacing than other first order cubic crystal planes, such as (100) and (110). This larger lattice spacing is a better match with many materials with hexagonal/wurtzite crystallinity, including III-N semiconductor materials, and is therefore advantageous for seeding heteroepitaxial growths of such materials. Substrate layer 215 may however also have other crystallographic orientations. For example, a (111) silicon crystal surface may be miscut or offcut, for example 2-10° toward [110] or [100], exposing higher order planes. In the illustrated example, substrate layer 215 is monocrystalline.

Substrate layer 215 may have a thickness (z-dimension in FIG. 2) that may vary with implementation. In some embodiments, the thickness of substrate layer 215 is minimized to maximize its mechanical compliance. With sufficient mechanical compliance, substrate layer 215 may advantageously strain under the stress of subsequent processing, as described further below. Substrate layer 215 advantageously has a thickness below 200 nm, more advantageously below 100 nm, and may even be 50 nm, or less.

Substrate layer 215 may be highly resistive. For high frequency (e.g., GHz band) devices (e.g., RFICs), electrical resistance of the substrate material upon which an IC is fabricated is often important. As an IC's operating frequency increases, parasitic losses associated with the substrate become more substantial unless the resistivity of the substrate material is increased. In some embodiments substrate layer 215 has a resistivity of at least 500 ohm-cm, and advantageously at least 1000 ohm-cm. Substrate layer 215 may have any and all of the attributes described above. For example, in some embodiments substrate layer 215 is (111) silicon, with a thickness no more than 100 nm, and a resistivity of at least 500 ohm-cm.

Substrate layer 215 is over a second, lower, substrate layer 205 with a layer of substrate dielectric 210 therebetween. Substrate layer 205 is generally thicker than substrate layer 215. Although there may be any number of substrate layers, in the illustrated embodiment substrate layer 205 is a bulk crystalline substrate layer of a bi-layer SOI substrate. Substrate layer 205 may therefore have any thickness ranging from tens to many hundreds of micrometers (e.g., 800 pin).

In some exemplary embodiments, substrate layer 205 has a lower resistivity than substrate layer 215. This lower resistivity may be beneficial because high-resistivity substrates can cause complications during the IC fabrication process. For example, plasma etching and plasma enhanced chemical vapor deposition (PECVD), for example, may induce a local build-up of electrical charges. A lower resistivity (higher conductivity) of substrate layer 205 may be leveraged to mitigate such issues. In some embodiments substrate layer 205 has a resistivity below 500 ohm-cm, and advantageously less than 100 ohm-cm.

In some embodiments, lower substrate layer 205 has (100) crystal orientation. A top surface of substrate layer 205 is a (100) crystal plane of a group IV material (e.g., Si, Ge, or SiGe) having cubic crystallinity, which is well suited to the fabrication of silicon CMOS circuitry. Other crystallographic orientations are also possible. For example, a (100) silicon surface may be miscut or offcut, for example 2-10° toward [110]. In the illustrated example, substrate layer 205 is also monocrystalline (100) silicon. Substrate layer 205 may have any and all of the attributes described above. For example, in some embodiments substrate layer 205 is (100) silicon, with a thickness of at least 50 μm, and a resistivity of less than 500 ohm-cm.

Substrate dielectric 210 may be any suitable dielectric material, such as a buried silicon dioxide (BOX) layer. Substrate dielectric 210 may have any ratio of oxygen and silicon constituents, for example. Other dielectric material compositions are also possible, such as, but not limited to materials having a relative permittivity below 3.5, and even below 3.0. The thickness (z-dimension in FIG. 2) of the layer of substrate dielectric 210 may vary with implementation. The thickness may be targeted, for example, based on device performance parameters, such as electrical isolation between circuitry formed over substrate layer 215 and substrate layer 205. For example, where an SOC fabricated from SOI substrate 201 is to include a high voltage regulator over substrate layer 215, the layer of substrate dielectric 210 may be thin (50-200 nm). Where an SOC is to include a high frequency RF circuit (e.g., a power amplifier) over substrate layer 215, the layer of substrate dielectric 210 may be thick (e.g., 1-2 μm, or more) to provide better noise isolation at high frequencies (e.g., >2 GHZ). As the thickness of the layer of substrate dielectric 210 may also be designed to minimize non-planarity between two regions of substrate 201, conflicting thickness constraints may be mitigated, at least in part, by removing at least a portion of the layer of substrate dielectric 210, as described further below.

Notably, methods 101 may be practiced over a range of substrate areas with processing following a variety of sequences. In addition to the SOI substrate size varying (e.g., 300 mm or 450 mm diameters), the area of a SOI substrate of a given size (e.g., 300 mm diameter) that is apportioned between a III-N device region and a Group IV device region may also vary with implementation. For example, in some embodiments a continuous III-N material layer is formed over an entire diameter of an SOI substrate. In some such embodiments, portions of the III-N material are subsequently removed (e.g., with any suitable etch process) to expose regions of the SOI substrate where silicon-based devices are to be fabricated. Alternatively, portions of an SOI substrate where silicon-based devices are to be fabricated may be defined prior to III-N epitaxial processing with III-N material growth and then limited to only the substrate areas that are not to host silicon-based devices. In other embodiments, III-N material growth may be confined to even smaller regions (e.g., through pinholes in a growth mask) so that many discrete islands or mesas of III-N material may span the entire diameter of an SOI substrate. If silicon-based devices are to fabricated as well, regions of the SOI substrate where the silicon-based devices are to be fabricated may then be defined around the III-N material islands. Alternatively, regions of the SOI substrate where silicon-based devices are to be fabricated may be defined prior to defining a III-N epitaxy growth mask that further confines III-N material growth to islands within a region that is outside of the silicon-based device region.

FIG. 3A-3G provide cross-sectional views illustrating exemplary embodiments of methods 101 where a III-N material is to be heteroepitaxial grown over large expanses of a substrate, for example exceeding 1 mm$^2$. FIG. 4A-4G provide cross-sectional views illustrating exemplary embodiments of methods 101 where a III-N material is to be heteroepitaxial grown within confined regions of a substrate (e.g., below 1 mm$^2$, and advantageously below 1000 μm$^2$). In the example shown in FIG. 3A, substrate 201 has been patterned to define a III-N device region 306, and a silicon-based device region 307. For alternative embodiments where no silicon-based devices are fabricated, region 307 is absent. Substrate layer 215 and substrate dielectric 210 are present only within III-N device region 306. Substrate layer 215 is covered with a dielectric layer 316, which may be and dielectric material, such as, but not limited to, SiO$_x$, SiN$_x$, SiON, SiOC(H), HSQ, MSQ, or other low-k materials. Within device region 307, substrate layer 215 and substrate dielectric 210 are absent, for example having been etched away with one or more masked etch process known to be suitable for the materials. Raised Group IV material 326 is on substrate layer 205 within device region 307. In some embodiments, raised Group IV material 326 is epitaxially grown within device region 307 in preparation for silicon-based device (e.g., MOSFET) fabrication. Any known silicon epitaxial growth process may be employed to form raised Group IV material 326. In the exemplary embodiment, raised Group IV material 326 is (100) monocrystalline silicon propagated from a seeding surface of substrate layer 205. If desired, a planarization process (e.g., chemical-mechanical polish) may be performed to planarize a top surface of device regions 306 and 307. Alternatively, where planarity of regions 306 and 307 is not a concern, planarization processes may be omitted. Similarly, epitaxial growth of raised Group IV material 326 may also be omitted where silicon-based devices are instead to be fabricated directly on substrate layer 205.

Figure 4A:
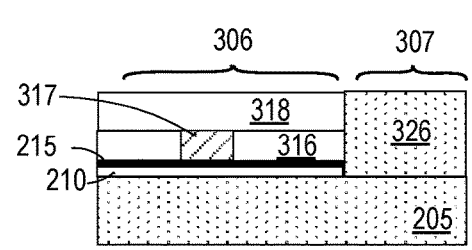

In the example shown in FIG. 4A, substrate 201 is also patterned to define III-N device region 306, and silicon-based device region 307. Substrate layer 215 and substrate dielectric 210 are only present within III-N device region 306, with raised Group IV material 326 (e.g., silicon) directly on substrate layer 205. Within region 306, substrate layer 215 is covered with dielectric layer 316 as well as a mask material 317. Mask material 317 may be of any composition. One of dielectric layer 316 and mask material 317 may be patterned with any suitable masked etch, and the other of dielectric layer 316 and mask material 317 then deposited over the patterned layer. Surfaces of dielectric layer 316 and mask material 317 may then be planarized and patterned to expose substrate layer 215 within region 307. Substrate layer 215 and substrate dielectric 210 may then be removed, for example where not protected by an overlying mask material layer 318 of any suitable composition. Raised Group IV material 326 may be epitaxially grown within device region 307 in preparation for silicon-based device (e.g., MOSFET) fabrication. In the exemplary embodiment, raised Group IV material 326 is (100) monocrystalline silicon propagated from a seeding surface of substrate layer 205. If desired, a planarization process (e.g., chemical-mechanical polish) may be performed to planarize a top surface of raised Group IV material 326 with mask material layer 318. Alternatively, where planarity of regions 306 and 307 is not a concern, planarization may be omitted. Similarly, epitaxial growth of raised Group IV material 326 may also be omitted where silicon-based devices are instead to be fabricated directly on substrate layer 205.

Returning to FIG. 1, methods 101 continue at operation 115 where one or more layer of III-N material is heteroepitaxially grown over a (111) silicon substrate layer. As noted above, the heteroepitaxial growth process may form III-N material over the entire SOI substrate wherever the (111) substrate layer is present. Alternatively, portions of the (111) substrate layer may be covered with a growth mask to further limit the formation of III-N material within the III-N device region. One or more layers of III-N material may be grown during operation 115. In some embodiments, the III-N semiconductor material grown at operation 115 is a III-N semiconductor stack. Any known III-N heteroepitaxial growth process may be employed at operation 115, such as, but not limited to, molecular beam epitaxy (MBE), metal-organic chemical vapor deposition (MOCVD), vapor phase epitaxy (VPE), or any other technique known to be suitable for III-N material growth. In some embodiments, elevated temperatures of 900° C., or more, are employed to epitaxially grow a GaN crystalline structure. Intrinsic III-N material (having no intentional donor or acceptor impurity doping) may be grown at operation 115.

Figure 3B:
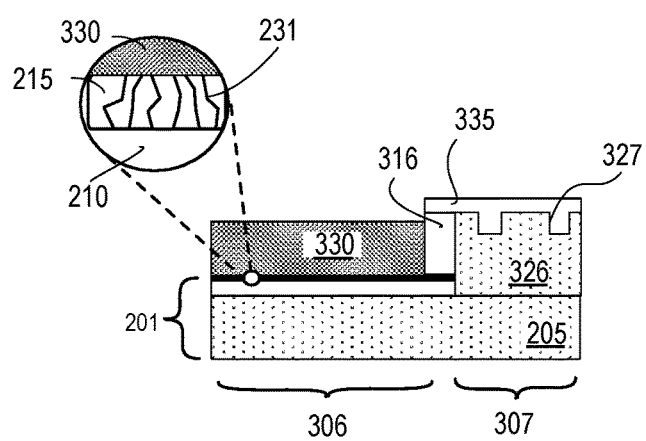
FIGS. 3B and 4B are cross-sectional views illustrating epitaxial growth of III-N semiconductor within a region of a substrate, formed in accordance with some embodiments of the methods illustrated in FIG. 1.

In the example shown in FIG. 3B, III-N material 330 is grown over substantially the entire III-N device region 306, wherever dielectric material 316 has been removed. Residual dielectric material 316 laterally (e.g., in the x-dimension) separates III-N material 330 from raised Group IV material 326. In some exemplary embodiments, III-N material 330 is substantially monocrystalline having the hexagonal/wurzite c-axis substantially orthogonal to the (111) plane of silicon substrate layer 215. Advantageously, the c-plane of the III-N material is no more than 10° from parallel to the (111) plane of silicon substrate layer 215. In some exemplary embodiments, III-N material 330 includes a buffer layer grown directly on exposed regions of substrate layer 215. While any known buffer structure may be employed, examples include a AlN and/or AlGaN nucleation layer directly on the (111) silicon surface, with one or more AlGaN and/or GaN layers grown on the nucleation layer. III-N material 230 may be grown to a z-thickness of 1-3 μm, or more, for example. While large-area heteroepitaxial processes can be challenging where there is a large lattice parameter mismatch and/or large thermal expansion mismatch between the seeding crystal and the epitaxial crystal, these sources of stress may be mitigated by the compliance of substrate layer 215. For example, as shown in the expanded inset for FIG. 3B, crystal defects 331 may form substrate layer 215 at a point during epitaxial growth of III-N material 330 when substrate layer 215 becomes more compliant than the layer of III-N material 330. Substrate layer 215 may yield to stresses developed during heteroepitaxy of III-N material 330. The lower strain point of the compliant substrate crystal may reduce defect propagation within III-N material 330 relative to growths performed upon a thicker, less compliant, growth substrate (e.g., having a thickness that remains greater than the heteroepitaxial III-N material throughout entire growth process). As such, III-N material 330 may be of superior crystal quality and/or a thinner buffer layer may be required to achieve a III-N material surface having given defect density target suitable for a desired III-N device to be fabricated.

As further illustrated in FIG. 3B, during epitaxial growth of III-N material 330, device region 307 is protected from III-N material overgrowth by an amorphous masking material 335, which, for example, may be any of the materials provided above as being suitable for dielectric material 316. Notably, device region 307 may also have undergone various processing prior to epitaxial growth of III-N material. For example, in FIG. 3B, fins 327 have been patterned into raised Group IV material 326 in preparation for finFET fabrication. In alternative embodiments however, all processing of device region 307 is performed after epitaxial growth operation 115.

Figure 4B:
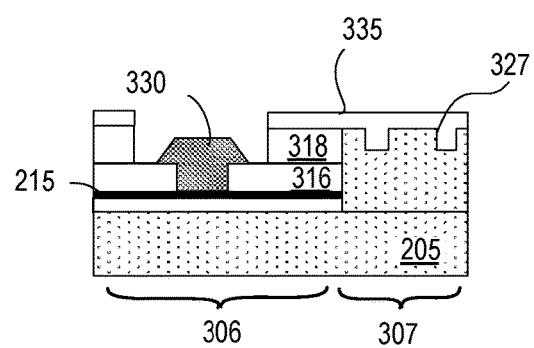

In the example shown in FIG. 4B, III-N material 330 is epitaxially grown within the III-N device region 306 only where mask material 317 has been removed. In some exemplary embodiments, amorphous masking material 335 is patterned with an opening that overlaps mask material 317. Any suitable etch process(es) may be employed to etch through the layer of amorphous masking material 335, as well as through mask material layer 318. The etch process(es) may stop on dielectric material 316 allowing mask material 317 to be removed and thereby forming a window or pinhole opening that exposes substrate layer 215. Any suitable epitaxial growth may then be employed to form III-N material 330. In the example shown, after growth of a nucleation layer (not depicted), a buffer of III-N material (e.g., GaN) is grown with first epitaxial growth conditions (e.g., a first growth pressure, a first growth temperature, and a first V/III growth precursor ratio). The hexagonal/wurtzite c-axis of the buffer material is advantageously substantially orthogonal to the (111) plane of silicon substrate layer 215. Following an initial growth period, growth conditions may be changed to a second growth temperature, and/or second growth pressure, and/or a second V/III growth precursor ratio favoring lateral epitaxial overgrowth (LEO) of III-N material (e.g., GaN) to extend III-N material 330 over a top surface of dielectric material 316. In some embodiments, the LEO process employed favors formation of inclined sidewall facets. Overgrowth at rates that favor wurtzite crystal facets non-parallel and non-normal (e.g., ~60°) to the c-plane have been found to bend defects away from the c-plane and toward the sidewalls such that the quality of a top surface of the III-N crystalline structure can improve with overgrowth time. Upon termination of operation 115, III-N material 330 has a trapezoidal profile, the dimensions of which depend on growth time.

Sources of stress within III-N material 330 may be mitigated by the compliance of substrate layer 215. As described above, crystal defects may be generated within substrate layer 215 as the more compliant layer at some point during the growth of III-N material 330. Substrate layer 215 may yield to stresses developed during the heteroepitaxy of III-N material 330. The lower strain point of the compliant substrate crystal may reduce defect propagation within III-N material 330 so that III-N material 330 may be of superior crystal quality.

As further illustrated in FIG. 4B, during epitaxial growth of III-N material 330, device region 307 is protected from III-N material overgrowth with amorphous masking material 335. Device region 307 may also have undergone various processing prior to epitaxial growth of III-N material, such as, but not limited to, the formation of fins 327. In alternative embodiments however, all processing of device region 307 is performed after epitaxial growth operation 115.

Returning to FIG. 1, methods 101 continue at operation 120 where at least a portion of the substrate dielectric layer is removed from within the III-N device region of the SOI substrate. Removal of the substrate dielectric layer may advantageously reduce electrical coupling between the III-N devices fabricated within device region 306 and the substrate layer 205 during operation of an SOC. Parasitic coupling losses between III-N devices and an underlying substrate can be high particularly where substrate layer 205 has relatively low resistivity (e.g., below 500 ohm-cm, or even below 100 ohm-cm) and the III-N devices are to operate at high frequencies (e.g., GHz), typical, for example, of some RF circuitry. Where the dielectric layer is removed from between a III-N device and a substrate layer, power loss through the substrate may be reduced, rendering an SOC more efficient and/or improving battery lifetimes. To remove substrate material, operation 120 may entail opening vias through overlying III-N material or opening vias through adjacent (surrounding) dielectric material. Any anisotropic etch process may be utilized to expose the substrate, for example. An isotropic etch (e.g., wet or dry chemical etch) may then undercut substrate dielectric material. One or more of the crystalline substrate layer may also be etched in a similar manner, for example removing the substrate layer that seeded the III-N material epitaxy and/or removing or recessing a portion of an underlying substrate layer.

Figure 3C:
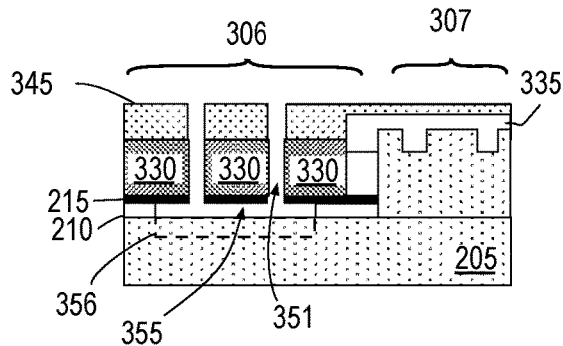
FIGS. 3C and 4C are cross-sectional views illustrating removal of at least a dielectric layer of an SOI substrate below III-N semiconductor within a region of a substrate, formed in accordance with some embodiments of the methods illustrated in FIG. 1.

In the example shown in FIG. 3C, a mask material 345 is deposited over SOI substrate 201. Mask material 345 may be any suitable material, such as any of those described above for mask material 318, and may be deposited using and deposition technique (e.g., CVD, plasma-enhanced CVD), spin-on, etc.). Vias 351 are defined in mask material 345. Exposed portions of III-N material 330 are etched, as are exposed portions substrate layer 215, so that vias 351 extend down to expose substrate dielectric 210. Any anisotropic etching process known to be suitable for the material compositions may be practiced to form vias 351 as embodiment are not limited in this respect. Substrate dielectric 210 is then undercut by a predetermined amount with a chemical etch (e.g., wet etch) suitable for the composition of substrate dielectric 210. As shown in FIG. 3C, a void 355 is located below portions of III-N material 230 while substrate dielectric 210 remains in other portions of III-N device region 306.

Figure 4C:
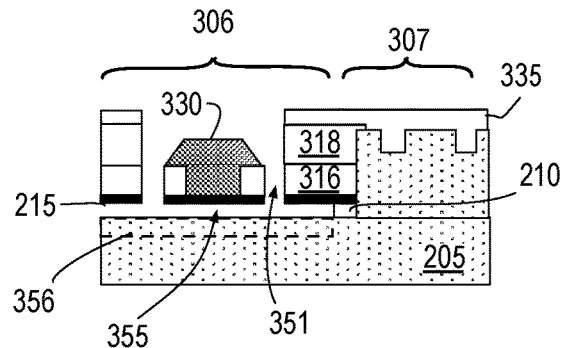

In the example shown in FIG. 4C, a self-aligned (i.e., maskless) anisotropic etch selective to dielectric material 316 is performed at operation 120. Exposed portions of III-N material 330 are not significantly etched so that self-aligned portions of substrate layer 215 surrounding III-N material 330 are exposed and may be subsequently etched with any etchant suitable for the composition (e.g., a silicon etchant). Following the self-aligned etch, vias 351 expose substrate dielectric 210, which may then be undercut with a suitable chemical etch (e.g., a wet or dry oxide etchant). As shown in FIG. 4C, a void 355 is located below III-N material 240 where substrate dielectric 210 is absent while substrate dielectric 210 remains in other portions of III-N device region 306.

In some embodiments, a portion of other substrate layers located below a III-N material are also etched, either to remove a substrate layer or recess a substrate layer to increase physical separation between the III-N material and a substrate layer. For example, in further reference to FIG. 3C and FIG. 4C, substrate layer 215 may also be removed from below III-N material 330. Although substrate layer 215 may have high resistivity, it may nevertheless be advantageous to remove a portion of substrate layer 215 local to the III-N material. Another chemical etchant, for example selective to silicon, may be employed to increase the size (e.g., in z-dimension) of void 355. Such an etchant may again access regions of substrate layer 215 exposed by vias 351. Substrate layer 205 may also be recessed from below III-N material 330. For example, an etchant selective to silicon may both etch through substrate layer 215 and recess substrate layer 205 within a finite region proximal to vias 351 (denoted with dashed line 356). The vertical dimension of void 355 may therefore be considerably larger (e.g., in z-dimension) than illustrated in FIG. 3C and FIG. 4C where only substrate dielectric 210 has been removed from below III-N material 330. Notably however, tight control over the dimensions of void 355 is not required as a reduction in parasitic coupling can be mitigated down to an acceptable threshold as long as the void 355 achieves some threshold dimension.

Depending on the implementation, void 355 may be completely backfilled with another material, or vias 351 may be sealed (occluded) with a material such that void 355 becomes a permanent feature of an SOC structure. Void 355 may, for example, be at least partially backfilled with a low-k material (e.g., having a lower relative permittivity than that of the material(s) removed to form void 355). In some embodiments, void 355 is at least partially backfilled with one or more of SiOC(H), perfluorocyclobutane, fluorosilicate glass (FSG), and organosilicates such as silsesquioxane (e.g., HSQ or MSQ). In the exemplary embodiments further illustrated in FIGS. 3D and 4D, an interlayer dielectric (ILD) material 350 has been deposited over device regions 306 and 307, and into vias 351. ILD material 350 may be any dielectric material having a composition suitable for ILD applications, such as but not limited to low-k materials (e.g., SiOC(H), perfluorocyclobutane, FSG, and organosilicates). Depending on the deposition technique, the material employed, and the aspect ratio of vias 351, ILD material 350 may only occlude vias 351 (e.g., as shown in FIG. 4C), or completely backfill void 355 (e.g., as shown in FIG. 4D).

Returning to FIG. 1, methods 101 continue at operation 125 where a III-N device is fabricated over, on, or in the III-N material that was formed at operation 115. Exemplary III-N devices that may be fabricated at operation 125 include, but are not limited to, diodes, light emitting diodes (LEDs), transistors, lasers, and piezoelectric sensors. In the illustrated embodiment, the III-N devices fabricated include transistors, and more specifically heterojunction field effect transistors (HFET). The transistors fabricated at operation 125 may have any architecture known to be suitable for an RFIC, power (high-voltage) IC, or a logic IC. In some embodiments, fabrication of the III-N device includes exposing a top surface of the III-N material. One or more III-N device layers may then be epitaxially grown upon the exposed surface of the III-N material. As such, the III-N material formed at operation 115 functions as a buffer between the III-N device layer formed at operation 125 and the underlying substrate. Alternatively, even III-N device layers may have been formed at operation 115.

Figure 3D:
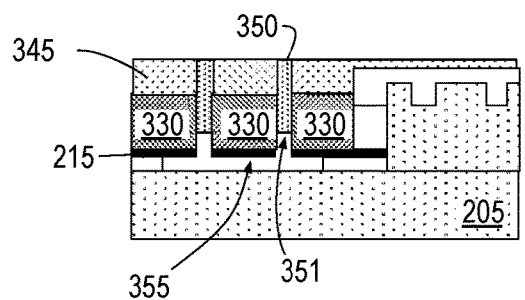
FIGS. 3D and 4D are cross-sectional views illustrating planarization of recesses formed through and/or around III-N semiconductor within a region of a substrate, formed in accordance with some embodiments of the methods illustrated in FIG. 1.
Figure 4D:
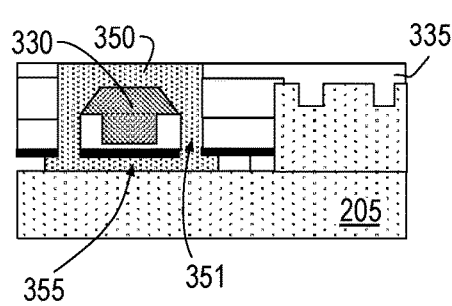
Figure 4E:
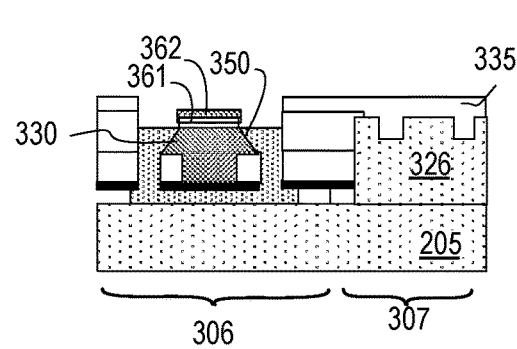

In the example shown in FIG. 3D, mask material 345 is removed, for example with any suitable etchback process, to expose III-N material 330. Alternatively, a planarization process (e.g., polish) may be employed. ILD material 350 is retained at least within a portion of vias 351. In the example shown in FIG. 4D, ILD 350 is recessed, for example with any suitable etchback process, to expose III-N material 330. Alternatively, a planarization process (e.g., polish) may be employed. A transistor channel layer 361 (e.g., intrinsic GaN) is then epitaxially grown on III-N material 330, for example on the c-plane (0001) surface of III-N material 330. A polarization layer 362 is grown on channel layer 361. Polarization layer 362 may have any III-N composition that induces a two-degree charge gas (e.g., electron gas or hole gas) within channel layer 361. For embodiments where polarization layer 362 is grown on the c-plane surface of a GaN channel layer 361, polarization layer 362 induces a 2DEG of high charge density and high carrier mobility within channel layer 361 proximate to the interface of polarization layer 362. In some exemplary embodiments where channel layer 361 is binary GaN, polarization layer 362 includes at least one of an AlGaN and/or AlN and/or AlInN layer. Polarization layer 362 may have any suitable thickness, with an exemplary thickness range being 3-30 nm. During epitaxial growth, device region 307 remains masked, for example by masking material 335.

Additional masking and III-N epitaxial growth or deposition processes may be practiced as needed to fabricate a given device structure. For example, impurity (e.g., donor) doped III-N material) may be selectively grown as source and drain terminals according to any technique known. In the examples shown in FIGS. 3F and 4F, source and drain terminals 371 are coupled to device layer (e.g., 2DEG) 361 on opposite sides of a gate electrode stack that includes a gate electrode 372 separated from channel layer 361 by a gate dielectric 373. Gate electrode 372, along with a pair of source/drain terminals 371 on opposite sides of gate electrode 372, are operable as a first transistor based on electric field modulation of the 2DEG.

Returning to FIG. 1, methods 101 continue at operation 130, where Group IV-based devices are optionally fabricated within the second substrate region. Exemplary silicon-based devices that may be fabricated at operation 130 include, but are not limited to, diodes, light emitting diodes (LEDs), photovoltaics, transistors, and optical sensors. In the illustrated embodiment, the silicon-based devices include transistors, and more specifically n-type and p-type MOSFETs may be fabricated to form any desired CMOS circuitry. The transistors fabricated at operation 130 may have any architecture known to be suitable for a logic IC, for example. Notably, the sequence of operations 125 and 130 may be reversed from that illustrated. However, where fabrication of the III-N device includes an epitaxial growth of III-N material, for example to form semiconductor device terminals, it may be advantageous to perform such III-N growths prior to fabrication of silicon-based devices for the sake of accommodating the thermal budget of a MOSFET.

Figure 3E:
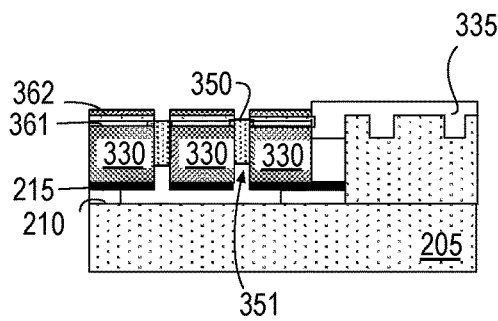
FIGS. 3E and 4E are cross-sectional views illustrating epitaxial growth of one or more III-N semiconductor device layers, formed in accordance with some embodiments of the methods illustrated in FIG. 1.
Figures 3F, 4F:
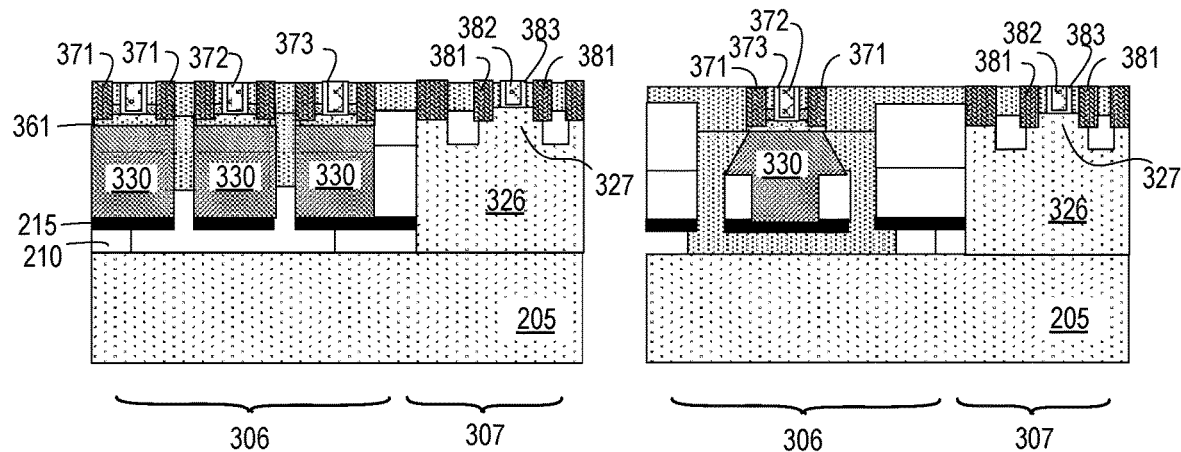
FIGS. 3F and 4F are cross-sectional views illustrating a plurality of HFET terminals disposed over a III-N semiconductor device layer in one region of a substrate, and a plurality of MOSFET terminals disposed over a Group IV semiconductor device layer, formed in accordance with some embodiments of the methods illustrated in FIG. 1.

In the example illustrated in FIGS. 3F and 4F, a gate stack includes a gate electrode 382 and a gate dielectric 383 is formed over fins 327 according to any known finFET fabrication technique. FinFET transistors include double-gate transistors and tri-gate transistors, and wrap-around or all-around gate transistors such as nanoribbon and nanowire transistors. A source and drain terminal 381 is formed on opposite sides of gate electrode 382. Gate electrode 382 and source/drain terminals 381 are operable as a transistor based on electric field modulation of channel conductivity. With the III-N and silicon substrate regions substantially planar, transistor fabrication processes within each device region 306, 307 may be performed concurrently in some advantageous embodiments. MOSFET fabricated within region 307 may also be planar transistors, or a combination of both planar and non-planar transistors.

Figures 3G, 4G:
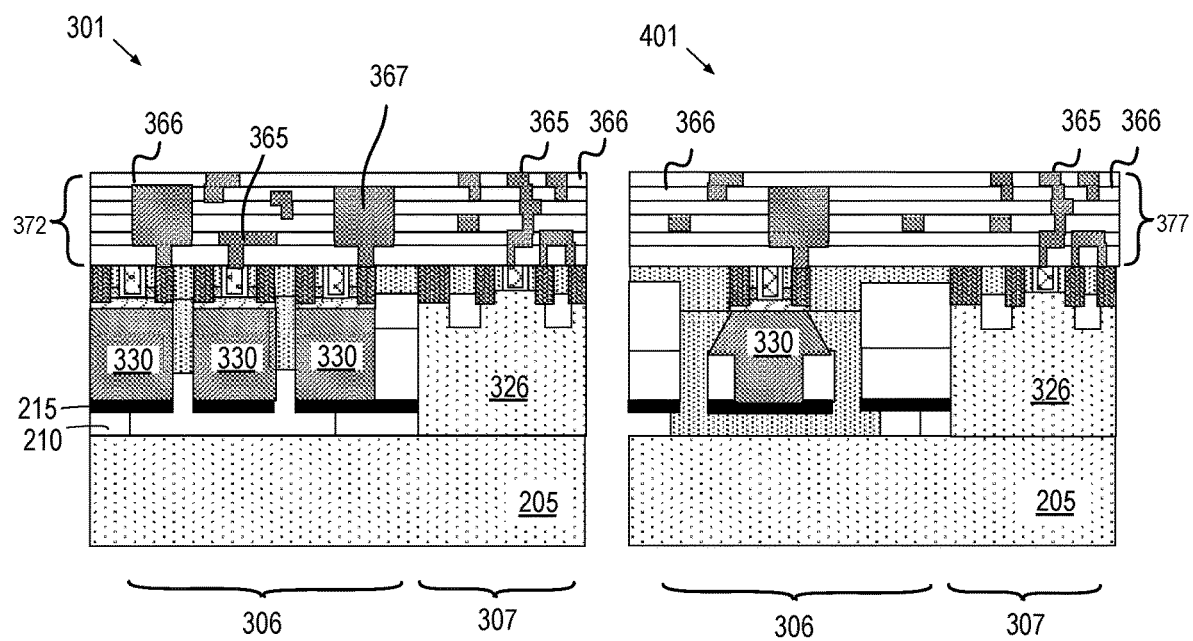
FIGS. 3G and 4G are cross-sectional views illustrating a plurality of metallization levels interconnecting Si-based MOSFETs into CMOS circuitry, and III-N-based HFETs into HFET circuitry, formed in accordance with some embodiments of the methods illustrated in FIG. 1.

In the examples shown in FIGS. 3F and 3G, the gate dielectric layers 373, 383 may each include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The gate electrodes 372, 382, may include at least one P-type work function metal or N-type work function metal, depending on conductivity type of the transistor channel. In some implementations, the gate electrodes 372, 382 include a stack of two or more metal layers, where one or more metal layers are work function metal layers and at least one metal layer is a conductive fill layer. For PMOS transistors fabricated in device region 307, metals that may be used for the gate electrode 382 include, but are not limited to, ruthenium, palladium, platinum, cobalt, nickel, and conductive metal oxides (e.g., ruthenium oxide). For NMOS transistors fabricated in device region 307, metals that may be used for the gate electrode layer 382 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. The same gate metals may be employed for gate electrodes 372. Alternatively, different gate metals (e.g., titanium nitride, etc.) may be employed for gate electrodes 372.

In some implementations, a pair of sidewall spacers may be formed on opposing sides of the gate stack that separate the gate stack from source and drain terminals 371, 381. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations.

Source and drain terminals 381 may be formed using either an implantation/diffusion process or an etching/deposition process. For example, dopants such as boron, aluminum, antimony, phosphorous, or arsenic may be ion-implanted into the (100) silicon to form the source and drain terminals 381. Alternatively, the (100) silicon may be first etched to form recesses and an epitaxial growth process may fill the recesses with source and drain terminals 381. In some implementations, the source and drain terminals 381 may be a silicon alloy such as silicon germanium or silicon carbide.

Returning to FIG. 1, methods 101 continue at operation 135 where the optional Group IV device (low voltage/frequency CMOS) circuitry is interconnected to III-N device (e.g., high voltage/frequency HFET) circuitry. In some embodiments, metallization levels and intervening ILD is fabricated over both device regions 306, 307, interconnecting all devices on the SOC concurrently. In some advantageous embodiments however, the number of metallization levels disposed over device region 306 differs from the number of metallization levels disposed over device region 307. For example, within device region 306 there may less than half the metallization layers that are present in device region 307. In exemplary embodiments where 9-10 metallization levels may be disposed over device region 307, only 1-5 metallization levels may be disposed over device region 306. A reduced metallization level count within the III-N device region may be associated with metallization levels that have significantly greater z-thicknesses than the levels employed in the Group IV device region. In some exemplary applications, HFET device density is much lower than that of the Si FETs. While a larger and/or lower transistor count within the HFET region of the substrate can be interconnected by fewer metallization levels, a higher interconnect power rating, and/or inductance may be beneficial to high-voltage (HV) circuitry of an integrated SOC. In one specific embodiment, where the III-N HFET circuitry within device region 306 comprises one or more RF power amplifier transistors, at least one thick metallization (e.g., >1.5 μm) level and/or thick ILD is routed within device region 306. In some embodiments, HFET circuitry disposed over the HFET region of the substrate includes an inductor. The inductor may be fabricated in at least one thick metallization level with any known technique. Use of the thick metallization may enable an inductor of advantageous quality factor (Q) to be fabricated over the HFET region within the same z-thickness occupied by the more numerous, but thinner metallization levels disposed over the Si FET region.

FIGS. 3G and 4G illustrating a plurality of interconnect metallization levels 377 interconnecting MOS transistor terminals into CMOS circuitry, formed in accordance with some embodiments. As illustrated, a plurality of metallization levels 365 and intervening ILD 366 is formed over device region 307. Within device region 306 however, fewer metallization levels 365 are formed (e.g., metal 1 illustrated). In the exemplary embodiment, the ILD levels 366 are present in both substrate regions 206, 207.

In some embodiments, formation of thick metallization within III-N HFET regions of the substrate entails etching a pattern through multiple ILD levels and backfilling the etched pattern in one plating operation. In other embodiments, formation of a thick metallization level within the III-N HFET regions of the substrate entails an iterative stacking of the metallization levels employed for Si FET circuitry. FIGS. 3G and 4G is a cross-sectional view illustrating a thick metallization level 367 within III-N HFETs circuitry, formed in accordance with some embodiments. In some exemplary embodiments, thick metallization level 367 implements an inductor having a z-thickness of at least 1.5 μm and disposed only over device region 306. Multiple ILD levels 366 corresponding to a least two metallization levels within device region 307 are patterned and backfilled to form thick metallization level 367. As further illustrated, thick metallization level 367 lands on an underlying metallization level 365, further increasing the effective III-N HFET metallization level thickness by forming a metallization stack including at least one Si FET metallization level. Doubling-up Si FET metallization layers to form thicker III-N HFET metallization and/or deposition of thicker III-N HFET metallization as illustrated in FIGS. 3G and 4G may be employed separately, or in combination, to differentiate the III-N HFET interconnect metallization from the Si FET interconnect metallization.

Methods 101 (FIG. 1) complete with an output of a monolithically integrated III-N and Si device (e.g., SOC). FIGS. 4G and 4H are cross-sectional views illustrating a monolithic SOCs 301, 401 including any and/or all of the device structures and properties described above. In some embodiments, SOCs 301, 401 include III-N (GaN) HFETs within high voltage circuitry of a power management integrated circuit, while Si FETs implement logic and/or controller functions in low voltage circuitry of the PMIC. In some other embodiments, SOCs 301, 401 include III-N (GaN) HFETs within high voltage power amplifier circuitry of an RF transceiver, while Si FETs implement logic and/or controller functions in low voltage circuitry of the RF transceiver.

Figure 5:
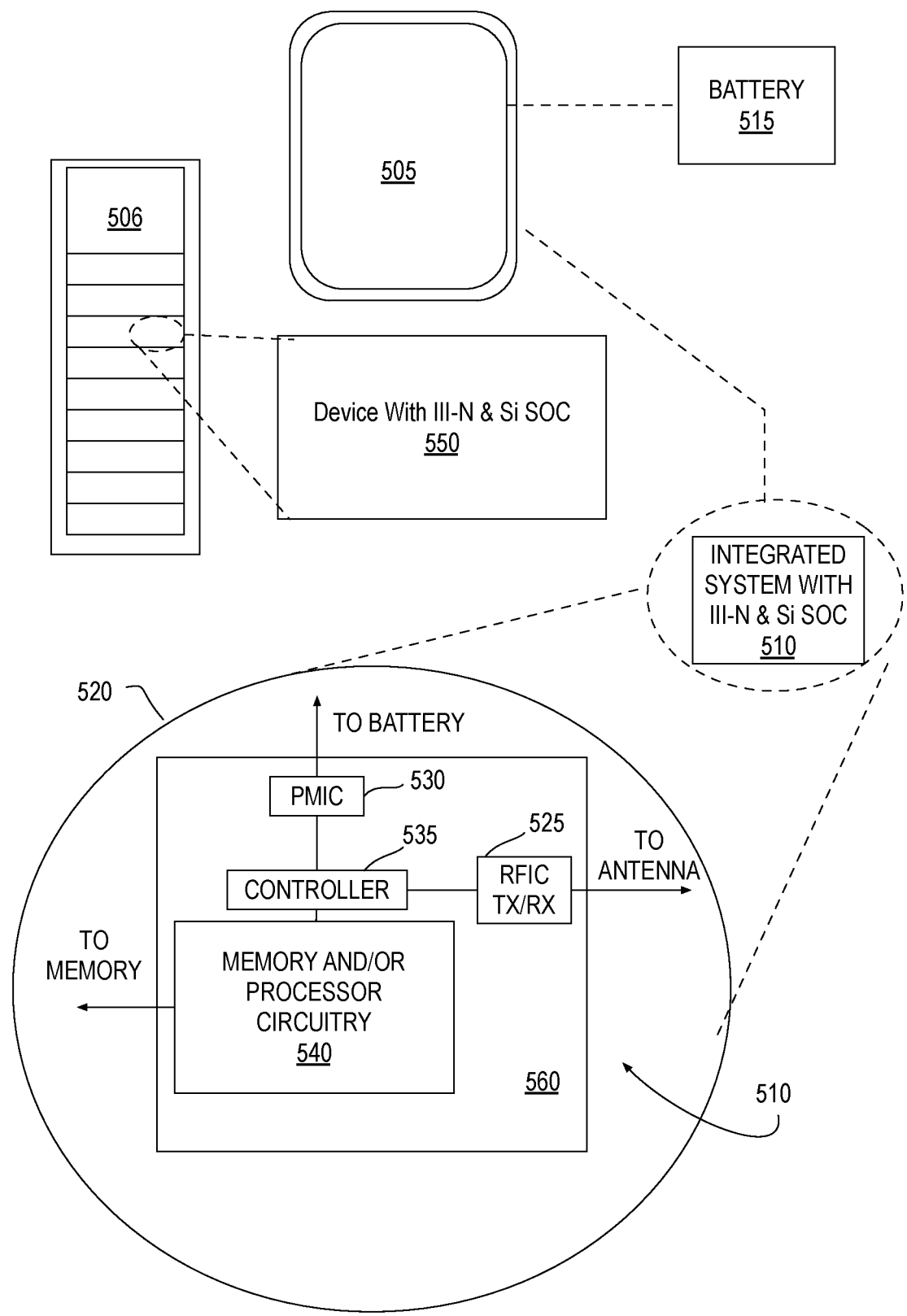
FIG. 5 is a schematic illustrating a mobile computing platform and a data server machine employing an SoC including both III-N HFET circuitry and Si-based CMOS circuitry, in accordance with some embodiments.

FIG. 5 illustrates a system 500 in which a mobile computing platform 505 and/or a data server machine 506 employs a monolithically integrated SOC including both III-N HFET circuitry and Si CMOS circuitry, for example in accordance with one or more embodiments described above. The server machine 506 may be any commercial server, for example including any number of high-performance computing platforms disposed within a rack and networked together for electronic data processing, which in the exemplary embodiment includes a packaged device 550.

The mobile computing platform 505 may be any portable device configured for each of electronic data display, electronic data processing, wireless electronic data transmission, or the like. For example, the mobile computing platform 505 may be any of a tablet, a smart phone, laptop computer, etc., and may include a display screen (e.g., a capacitive, inductive, resistive, or optical touchscreen), a chip-level or package-level integrated system 510, and a battery 515.

Whether disposed within the integrated system 510 illustrated in the expanded view 520, or as a stand-alone packaged device within the server machine 506, SOC 560 includes at least III-N HFET circuitry and Si-based CMOS (FET) circuitry. SOC 560 may further include a memory circuitry and/or a processor circuitry 540 (e.g., RAM, a microprocessor, a multi-core microprocessor, graphics processor, etc.). III-N HFET and Si-FET circuitry may implement high and low voltage portions, respectively, of one or more of PMIC 530, or RF (radio frequency) integrated circuitry (RFIC) 525 including a wideband RF transmitter and/or receiver (TX/RX). In some embodiments for example, SoC 560 includes a digital baseband and an analog front end module further comprising a power amplifier on a transmit path and a low noise amplifier on a receive path), and a controller 535.

Functionally, PMIC 530 may perform battery power regulation, DC-to-DC conversion, etc., and so has an input coupled to battery 515, and an output providing a current supply to other functional modules. As further illustrated, in the exemplary embodiment, RFIC 525 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these SoC modules may be integrated onto separate ICs coupled to a package substrate, interposer, or board.

Figure 6:
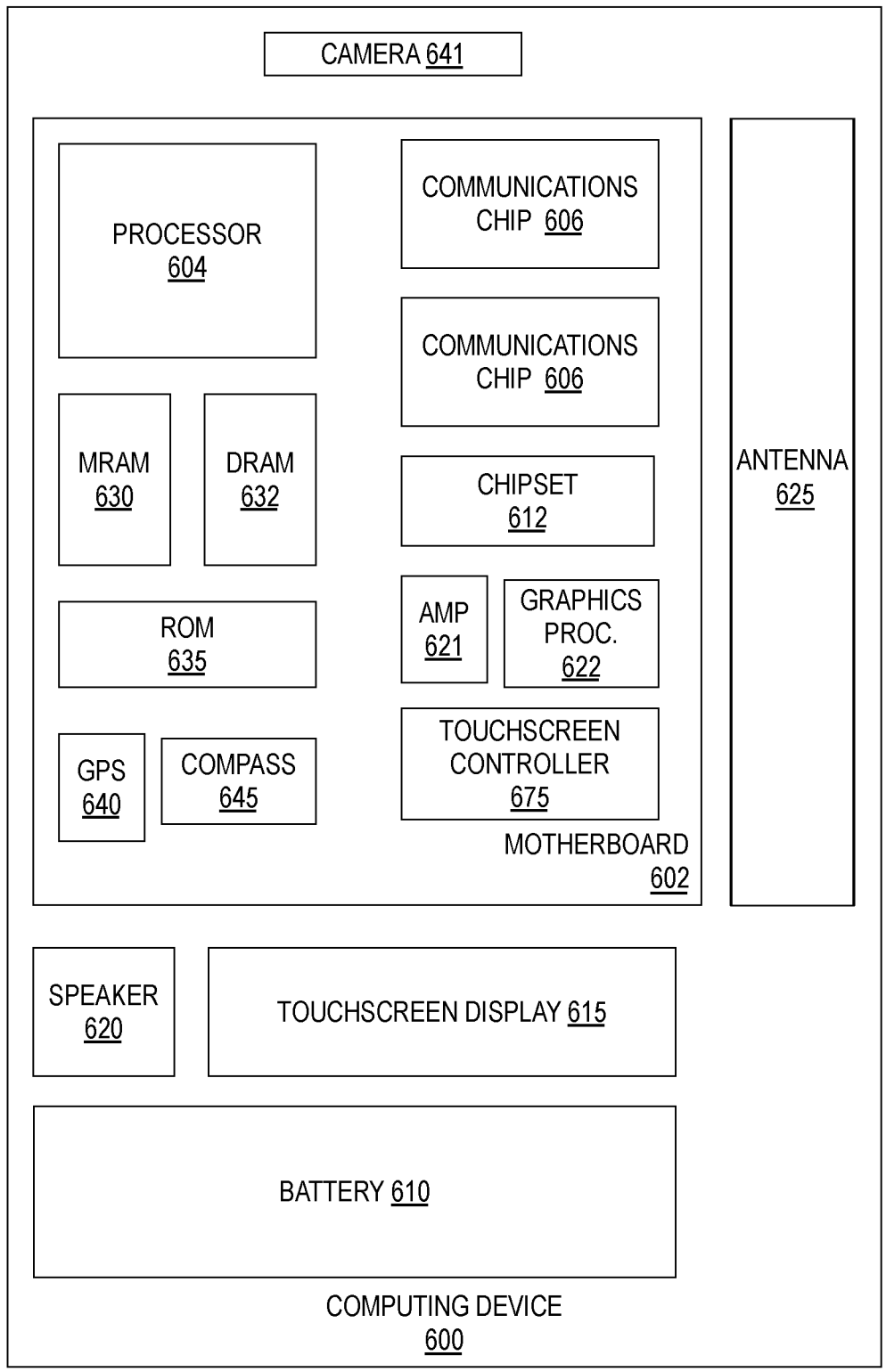
FIG. 6 is a functional block diagram illustrating an electronic computing device, in accordance with some embodiments.

FIG. 6 is a functional block diagram of a computing device 600, arranged in accordance with at least some implementations of the present disclosure. Computing device 600 may be found inside platform 505 or server machine 506, for example. Device 600 further includes a motherboard 602 hosting a number of components, such as, but not limited to, a processor 604 (e.g., an applications processor), which may further incorporate III-N HFET circuitry interconnected with Si FET circuitry, in accordance with embodiments of the present invention. Processor 604 may for example include power management integrated circuitry (PMIC) that includes III-N HFET circuitry interconnected with Si FET circuitry. Processor 604 may be physically and/or electrically coupled to motherboard 602. In some examples, processor 604 includes an integrated circuit die packaged within the processor 604. In general, the term "processor" or "microprocessor" may refer to any device or portion of a device that processes electronic data from registers and/or memory to transform that electronic data into other electronic data that may be further stored in registers and/or memory.

In various examples, one or more communication chips 606 may also be physically and/or electrically coupled to the motherboard 602. In further implementations, communication chips 606 may be part of processor 604. Depending on its applications, computing device 600 may include other components that may or may not be physically and electrically coupled to motherboard 602. These other components include, but are not limited to, volatile memory (e.g., MRAM 630, DRAM 632), non-volatile memory (e.g., ROM 635), flash memory, a graphics processor 622, a digital signal processor, a crypto processor, a chipset, an antenna 625, touchscreen display 615, touchscreen controller 675, battery 610, audio codec, video codec, power amplifier 621, global positioning system (GPS) device 640, compass 645, accelerometer, gyroscope, audio speaker 620, camera 641, and mass storage device (such as hard disk drive, solid-state drive (SSD), compact disk (CD), digital versatile disk (DVD), and so forth), or the like.

Communication chips 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 606 may implement any of a number of wireless standards or protocols, including but not limited to those described elsewhere herein. As discussed, computing device 600 may include a plurality of communication chips 606. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below:

In one or more first examples, an integrated circuit (IC) structure, comprises a first substrate layer comprising (111) silicon over a second substrate layer also comprising silicon within a region of the IC structure, wherein the first substrate layer is separated from the second substrate layer by a layer of substrate dielectric material, and a device comprising a Group III-Nitride (III-N) material above the first substrate layer within the region of the IC structure, wherein the substrate dielectric material is absent within at least a portion of the region that is below the device.

In one or more second examples, for any of the first examples, the first substrate layer has a thickness no more than 100 nm, the second substrate layer has a lower electrical resistivity than the first substrate layer, and the layer of substrate dielectric material has a thickness greater than that of the first layer.

In one or more third examples, for any of the first through second examples the layer of substrate dielectric material comprises silicon and oxygen, and the first substrate layer has a thickness no more than 50 nm.

In one or more fourth examples, for any of the first through third examples a void is present between the III-N material and the second substrate layer within the portion of the region where the substrate dielectric material is absent.

In one or more fifth examples, for any of the fourth examples the IC structure further comprises an isolation dielectric material laterally adjacent to the III-N material, and a non-conductive via that intersects the portion of the region where the substrate dielectric material is absent, and extends through at least one of the isolation dielectric material and the III-N material.

In one or more sixth examples, for any of the first through the fifth examples the first substrate layer is absent within the portion of the region below the device.

In one or more seventh examples, for any the second examples the second substrate layer comprises (100) silicon, the (III-N) material is above the first substrate layer within a first region of the IC structure, a second device comprising a Group IV material is above the second substrate layer within a second region of the IC structure, and one or more metallization levels electrically couples the first device to the second device.

In one or more eighth examples, for any of the seventh examples the device comprises a III-N heterostructure field effect transistor (HFET), and the second device comprises a metal-oxide-semiconductor (MOS)FET.

In one or more ninth examples, for any of the eighth examples the MOSFET is on a surface of raised (100) silicon in contact with the second substrate layer, and an isolation dielectric surrounds the III-N material, laterally separating the III-N material from the raised (100) silicon.

In one or more tenth examples, for any of the first through the ninth examples the III-N material is between a III-N buffer and a III-N polarization layer that is on a c-plane of the III-N material, the III-N buffer in contact with the first substrate layer and having a thickness of at least 1 μm, and the polarization layer has a composition that induces a 2D electron gas in a channel region of the III-N semiconductor layer.

In one or more eleventh examples, for any of the first through the ninth examples, the IC structure further comprises one or more metallization levels, wherein the one or more metallization levels further comprise a first metallization level over first gate electrodes and first source/drain terminals within the first region of the IC, a second metallization level over second gate electrodes and second source/drain terminals within the second region of the IC, and a third metallization level over both the first metallization level and the second metallization level, the third metallization level interconnecting the first metallization level with at least an uppermost one of the second metallization levels.

In one or more twelfth examples, a system-on-chip (SOC), comprises RF circuitry comprising the first device of any one of the first through the ninth examples, and processor circuitry coupled to the RF transceiver circuitry, wherein the processor circuitry comprises the second device of the first through the ninth examples.

In one or more thirteenth examples, a system-on-chip (SOC), comprises RF circuitry comprising one or more heterostructure field effect transistors (HFETs) including a Group III-Nitride (III-N) material within a first region of the SOC that further includes a first substrate layer comprising (111) silicon separated from a second substrate layer comprising (100) silicon by a layer of dielectric material, and processor circuitry coupled to the RF circuitry, wherein the processor circuitry comprises one or more metal-oxide-semiconductor (MOSFETs) including the (100) silicon within a second region of the SOC that lacks the first substrate layer, and wherein the layer of dielectric material is absent within a portion of the first region below the HFETs.

In one or more fourteenth examples, for any of the thirteenth examples the HFETs further comprise a gate electrode disposed over a (0001) surface of the III-N material, the second substrate layer has a lower electrical resistivity than the first substrate layer, the first substrate layer has a thickness less than 100 nm, and the layer of dielectric material comprises silicon and oxygen and has a thickness of at least 500 nm.

In one or more fifteenth examples, for any of the fourteenth examples a void is present between the HFET and second substrate layer, and within the void one or more of: the layer of dielectric material is absent; the first substrate layer is absent; or the second substrate layer is recessed relative to other portions of the first region of the SOC.

In one or more sixteenth examples, a method of fabricating a Group III-Nitride (III-N) device, comprises receiving a substrate with a first substrate layer comprising (111) silicon over a second substrate layer also comprising silicon within a region of the substrate, wherein the first substrate layer is separated from the second substrate layer by a layer of substrate dielectric material. The method comprises epitaxially growing a Group III-Nitride (III-N) material on the first substrate layer within the region of the substrate. The method comprises forming one or more heterostructure field effect transistors (HFETs) comprising the III-N material. The method comprises removing at least a portion of the substrate dielectric layer that is below the HFET.

In one or more seventeenth examples, for any of the sixteenth examples the method comprises forming an isolation dielectric material around the III-N material, and exposing the substrate dielectric layer by etching an opening through the first substrate layer and at least one of the III-N material or isolation dielectric material.

In one or more eighteenth examples, for any of the sixteenth through seventeenth examples the method further comprises at least one of removing the first substrate layer or etching a recess into the second substrate layer within a portion of the region of the substrate below the HFET.

In one or more nineteenth examples, for any of the sixteenth through eighteenth examples the method further comprises forming one or more MOSFETs comprising (100) silicon over the second substrate layer within a second region of the substrate, and interconnecting the HFETs with the MOSFETs.

In one or more twentieth examples, for any of the nineteenth examples the method comprises exposing the second substrate layer by removing the first substrate layer and the layer of substrate dielectric material within the second region, and epitaxially growing (100) silicon from the second substrate layer within the second region.

In one or more twenty-first examples, for any of the sixteenth through the twentieth examples, growing the III-N material further comprises growing a polarization layer from at least a (0001) surface of an underlying III-N layer, the polarization layer having a composition that induces a 2D electron gas (2DEG) in the III-N semiconductor layer, and forming the one or more HFETs further comprises forming first gate electrodes and first source/drain terminals over the polarization layer.

In one or more twenty-second examples, for any of the sixteenth through twenty-first examples the second substrate layer comprises (100) silicon, and the second substrate layer and has an electrical resistivity that is lower than that of the first substrate layer.

In one or more twenty-third examples, for any of the sixteenth through twenty-first examples the first substrate layer has a thickness no more than 100 nm.

In one or more twenty-fourth examples, for any of the sixteenth through twenty-first examples the layer of substrate dielectric material comprises silicon and oxygen, and the first substrate layer has a thickness no more than 50 nm.

In one or more twenty-fifth examples, for any of the sixteenth through twenty-first examples the method further comprises forming one or more metallization levels, wherein forming the one or more metallization levels further comprises forming a first metallization level over first gate electrodes and first source/drain terminals within the region of the IC, forming a second metallization level over second gate electrodes and second source/drain terminals within a second region of the IC, and forming a third metallization level over both the first metallization level and the second metallization level, the third metallization level interconnecting the first metallization level with at least an uppermost one of the second metallization levels.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) structure, comprising:
a first substrate layer comprising (111) silicon;
a first dielectric material in direct contact with the first substrate layer;
a first Group III-Nitride (III-N) material within an opening in the first dielectric material, where the first Group III-N material has a c-axis substantially orthogonal to a (111) plane of the first substrate layer;
a second dielectric material between the first substrate layer and an underlying second substrate layer comprising crystalline silicon;
a void, or a material of lower relative permittivity than that of the second dielectric material, between the first Group III-N material and the second substrate layer, co-planar with the second dielectric material, and co-linear with the c-axis; and
a transistor comprising a second Group III-N material, wherein the second Group III-N material is epitaxial to the first Group III-N material.

2. The IC structure of claim 1, wherein:
the first substrate layer has a thickness no more than 100 nm;
the second substrate layer has a lower electrical resistivity than the first substrate layer; and
the first dielectric material has a thickness greater than that of the first substrate layer.

3. The IC structure of claim 2, wherein:
the transistor is a first transistor;
the second substrate layer comprises (100) silicon;
the first Group III-N material is in direct contact with the first substrate layer within a first region of the IC structure;
a second transistor comprising a Group IV material is above the second substrate layer within a second region of the IC structure; and
one or more metallization levels electrically couples the first transistor to the second transistor.

4. The IC structure of claim 3, wherein:
the transistor comprises a III-N heterostructure field effect transistor (HFET); and
the second transistor comprises a metal-oxide-semiconductor (MOS)FET.

5. The IC structure of claim 1, wherein:
the second dielectric material comprises silicon and oxygen; and
the first substrate layer has a thickness no more than 50 nm.

6. The IC structure of claim 1, wherein the void is between the first substrate layer and the second substrate layer where the second dielectric material is absent.

7. The IC structure of claim 6, further comprising:
a non-conductive via that intersects the void, and extends through at least one of the first dielectric material or the first Group III-N material.

8. The IC structure of claim 1, wherein a portion of the first substrate layer co-linear with the c-axis is also absent.

9. The IC structure of claim 1, wherein:
the second Group III-N material is between the first Group III-N material and a Group III-N polarization layer that is on a c-plane of the second Group III-N material, the second Group III-N material having a thickness of at least 1 µm; and
the Group III-N polarization layer has a composition that induces a 2D electron gas in a channel region of the second Group III-N material.

10. The IC structure of claim 1, further comprising one or more metallization levels, wherein the one or more metallization levels further comprise:
a plurality of first metallization levels over first gate electrodes and first source/drain terminals within a first region of the IC;
a plurality of second metallization levels over second gate electrodes and second source/drain terminals within a second region of the IC; and
a third metallization level over both the first metallization levels and the second metallization levels, the third metallization level interconnecting at least an uppermost one of the first metallization levels with the second metallization levels.

11. A system-on-chip (SOC), comprising:
RF circuitry comprising the IC structure of claim 1; and
processor circuitry coupled to the RF circuitry, wherein the processor circuitry comprises one or more metal-oxide-semiconductor (MOSFETs) including (100) silicon within a second region of the IC structure that lacks the first substrate layer.

12. The SOC of claim 11, wherein:
the IC structure further comprises a gate electrode over a (0001) surface of the second Group III-N material;
the second substrate layer has a lower electrical resistivity than the first substrate layer;

the first substrate layer has a thickness less than 100 nm; and the second dielectric material comprises silicon and oxygen and has a thickness of at least 500 nm.

13. The SOC of claim 11, wherein the void is present between the transistor and the second substrate layer, and within the void one or more of:

the second dielectric material is absent;

the first substrate layer is absent; or the second substrate layer is recessed relative to other portions of the second substrate layer.

14. An integrated circuit (IC) structure, comprising:

a first substrate layer comprising (111) silicon over a second substrate layer also comprising silicon within a region of the IC structure, wherein the first substrate layer is separated from the second substrate layer by a layer of substrate dielectric material; and a device comprising a Group III-Nitride (III-N) material above the first substrate layer within the region of the IC structure, wherein the substrate dielectric material is absent within at least a portion of the region that is below the device, and wherein the device comprises a III-N heterostructure field effect transistor (HFET); and a second device comprising a Group IV material above the second substrate layer within a second region of the IC structure, wherein:

the second device comprises a metal-oxide-semiconductor (MOS)FET;

the MOSFET is on a surface of raised (100) silicon in contact with the second substrate layer; and an isolation dielectric surrounds the Group III-N material, laterally separating the Group III-N material from the raised (100) silicon.

* * * * *